(12) United States Patent
Ikemoto et al.

(10) Patent No.: US 9,558,440 B2
(45) Date of Patent: Jan. 31, 2017

(54) WIRELESS IC DEVICE

(71) Applicant: Murata Manufacturing Co., Ltd., Nagaokakyo-shi, Kyoto-fu (JP)

(72) Inventors: Nobuo Ikemoto, Moriyama (JP); Yuya Dokai, Nagaokakyo (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 31 days.

(21) Appl. No.: 14/331,337

(22) Filed: Jul. 15, 2014

(65) Prior Publication Data
US 2014/0319224 A1    Oct. 30, 2014

Related U.S. Application Data

(60) Division of application No. 12/496,709, filed on Jul. 2, 2009, now abandoned, which is a continuation of (Continued)

(30) Foreign Application Priority Data

Jul. 18, 2007   (JP) ................. 2007-186439

(51) Int. Cl.
*G06K 19/077* (2006.01)
*H04B 5/00* (2006.01)
(Continued)

(52) U.S. Cl.
CPC ......... *G06K 19/0723* (2013.01); *G06K 19/073* (2013.01); *G06K 19/07749* (2013.01);
(Continued)

(58) Field of Classification Search
CPC ............ G06K 19/077; G06K 19/07749; G06K 19/0775; G06K 19/0723; G06K 19/073; G06K 19/07777; G06K 19/077779; G06K 19/07781; G06K 19/07784; G06K 19/07756; H04B 5/0012; H01Q 1/2225; H01Q 1/40; H01Q 7/00; H01Q 7/005; H01Q 9/04; H01Q 9/16; H01Q 9/20
(Continued)

(56) References Cited

U.S. PATENT DOCUMENTS

| | | | |
|---|---|---|---|
| 8,653,975 B2 * | 2/2014 | Deavours | H01Q 1/38 340/572.7 |
| 9,077,067 B2 * | 7/2015 | Ikemoto | H01Q 5/35 |
| 2007/0164414 A1 * | 7/2007 | Dokai | G06K 19/07749 257/679 |

OTHER PUBLICATIONS

Ikemoto et al., "Wireless IC Device"; U.S. Appl. No. 12/496,709, filed Jul. 2, 2009.

* cited by examiner

*Primary Examiner* — Suezu Ellis
(74) *Attorney, Agent, or Firm* — Keating & Bennett, LLP

(57) ABSTRACT

An electromagnetic coupling module includes a wireless IC chip and a functional substrate. The electromagnetic coupling module is mounted on a radiation plate, preferably using an adhesive, for example. On the upper surface of a base material of the radiation plate, two long radiation electrodes are provided. On the undersurface of the functional substrate, capacitive coupling electrodes that individually face inner ends of the radiation electrodes are provided. A matching circuit arranged to perform the impedance matching between the wireless IC chip and each of the radiation electrodes includes the capacitive coupling electrodes. As a result, it is possible to reduce the size, facilitate the design, and reduce the cost of a wireless IC device.

12 Claims, 9 Drawing Sheets

Related U.S. Application Data application No. PCT/JP2008/062886, filed on Jul. 17, 2008.

(51) Int. Cl.
*H01Q 7/00*    (2006.01)
*G06K 19/07*    (2006.01)
*H01Q 1/22*    (2006.01)
*H01Q 1/40*    (2006.01)
*H01Q 9/16*    (2006.01)
*H01Q 9/20*    (2006.01)
*G06K 19/073*    (2006.01)

(52) U.S. Cl.
CPC ..... *G06K 19/07756* (2013.01); *H01Q 1/2225* (2013.01); *H01Q 1/40* (2013.01); *H01Q 7/00* (2013.01); *H01Q 9/16* (2013.01); *H01Q 9/20* (2013.01); *H04B 5/0012* (2013.01)

(58) Field of Classification Search
USPC ........ 235/492; 340/10.1, 572.1, 572.5, 572.7
See application file for complete search history.

WIRELESS IC DEVICE

BACKGROUND OF THE INVENTION

1. Field of the Invention

The present invention relates to a wireless IC device used for an RFID (Radio Frequency Identification) system for performing wireless data communication using electromagnetic waves.

2. Description of the Related Art

Recently, as a product management system, an RFID system has been used in which a reader/writer arranged to generate an induction field communicates with a wireless IC device attached to a product in a wireless manner so as to obtain predetermined information stored in the wireless IC device.

FIG. 1 is a diagram illustrating an example of a wireless IC tag (RFID tag) disclosed in Japanese Unexamined Patent Application Publication No. 2005-244778 in which an IC tag label is attached to an IC tag antenna.

In a wireless IC tag T0, a pair of main antenna elements 81, an auxiliary antenna element 82, and a pair of matching portions 83 are provided on the surface of a dielectric substrate 84.

The main antenna elements 81 are meandering antennas in which meandering conducting lines are provided, and are symmetrically arranged on the dielectric substrate 84. Between the main antenna elements 81 occupying areas at both ends of the dielectric substrate 84, the auxiliary antenna element 82 is disposed.

The matching portions 83 are meandering conducting lines (inductors). One end of each of the matching portions 83 is individually connected to an inner end of the main antenna elements 81, and the other end of each of the matching portions 83 is connected to a wireless IC chip 86.

However, the wireless IC tag disclosed in Japanese Unexamined Patent Application Publication No. 2005-244778 has the following problems. Since the matching portions are individually arranged adjacent to the main antennas on the same substrate, the size of the wireless tag is increased.

If the tag is attached to a product having a high dielectric constant, the frequency characteristics of the matching circuit portions are changed due to the influence of the dielectric constant of the product. Accordingly, the frequency characteristic of the tag is significantly changed. If a protection film arranged to cover the surface of a product to which the tag is attached or the surface of the tag, the impedances of the matching portions are changed. Accordingly, it is necessary to design the wireless tag in consideration of the use condition of the wireless tag.

Since the auxiliary antenna is used to increase the design flexibility of the main antenna elements, the size of the tag is increased. Since matching design is performed at portions other than the matching portions, the number of design parameters is increased and the design complexity of the tag is increased.

Since the IC chip must be mounted on a small mounting electrode on a large substrate on which the main antennas and the matching portions are disposed, a high-precision mounting apparatus is required. Since the mounting position adjustment requires a long period of time and the manufacturing time for the tag therefore is increased, the cost of the tag is increased.

Since each of the main antennas is connected to the IC chip so that the DC continuity between them is achieved, static electricity may flow from the main antenna into the wireless IC chip and break the wireless IC chip.

SUMMARY OF THE INVENTION

To overcome the problems described above, preferred embodiments of the present invention reduce the size and cost of a wireless IC device and facilitate the design of the wireless IC device.

A wireless IC device according to a preferred embodiment of the present includes a wireless IC chip, a radiation plate including a radiation electrode, and a functional substrate including an external coupling electrode coupled to the radiation electrode and a matching circuit arranged to perform impedance matching between the wireless IC chip and the radiation electrode. The matching circuit included in the functional substrate is determined such that a relationship between a reactance component of an impedance obtained by viewing the wireless IC chip from a connecting portion connecting the wireless IC chip and the functional substrate to each other and a reactance component of an impedance obtained by viewing the radiation electrode from the connecting portion connecting the wireless IC chip and the functional substrate to each other is a conjugate relationship.

The external coupling electrode is preferably electromagnetically coupled to the radiation electrode. The functional substrate preferably includes a multilayer substrate including laminated dielectric layers on which electrode patterns are provided.

The radiation electrode is preferably relatively long. The external coupling electrode preferably includes first and second external coupling electrodes that individually occupy two areas divided from the functional substrate. One of two ends of the radiation electrode is preferably coupled to the first external coupling electrode and the other one of the two ends of the radiation electrode is preferably coupled to the second external coupling electrode.

The radiation electrode is preferably a loop-shaped radiation electrode having two ends that face each other. One of the ends is preferably coupled to the first external coupling electrode. The other one of the ends is preferably coupled to the second external coupling electrode.

An auxiliary matching circuit portion preferably includes a matching electrode arranged to connect a location near one of the two ends of the radiation electrode to a location near the other one of the two ends of the radiation electrode, a portion of the radiation electrode from one of the two ends to the location near one of the two ends, and to connect a portion of the radiation electrode from the other one of the two ends to the position near the other one of the two ends.

The inductance elements are preferably loop-shaped inductance elements. Winding axes of the loop-shaped inductance elements are arranged so that they cross an area in which the radiation electrode is provided.

The external coupling electrode is preferably a capacitive coupling electrode that faces the radiation electrode and is capacitively coupled to the radiation electrode.

The capacitive coupling electrode is preferably disposed on a surface of the functional substrate facing the radiation plate. The radiation electrode is preferably disposed on a surface of the radiation plate facing the functional substrate. The functional substrate is preferably attached to the radiation plate so that the capacitive coupling electrode and the radiation electrode face each other.

The external coupling electrode included in the functional substrate preferably extends to a surface other than the surface of the functional substrate facing the radiation plate.

The external coupling electrode is preferably a loop-shaped external coupling electrode. The loop-shaped external coupling electrode is magnetically coupled to the radiation electrode.

At least one of the inductance elements preferably has a double helix shape in which two different linear electrodes are adjacent to each other. One end of one of the two different linear electrodes is preferably electrically connected to one end of the other one of the two different linear electrodes.

The radiation electrode preferably is a loop-shaped radiation electrode. The loop-shaped radiation electrode is preferably electromagnetically coupled to the inductance elements included in the functional substrate.

The matching circuit is preferably defined by an element included in the functional substrate and an element mounted on the functional substrate.

At least one of the wireless IC chip, the functional substrate, and the radiation plate is preferably covered with a protection film.

According to various preferred embodiments of the present invention, the following advantages are obtained. Since the wireless IC chip is mounted on the small functional substrate, it is possible to use an IC mounting apparatus in the related art and reduce the cost of mounting the wireless IC chip. Even if a wireless IC chip having a different output impedance is used and an RFID frequency characteristic is changed, it is only necessary to change the design of the matching circuit included in the functional substrate. This significantly reduces design costs.

Since the wireless IC chip and the functional substrate are DC-insulated from the radiation electrode, it is possible to prevent the wireless IC chip and the functional substrate from being broken by static electricity and improve the resistance of the wireless IC device to static electricity.

Since the inductance elements and/or the capacitance element are included in the multilayer substrate, it is possible to stabilize an inductance value and a capacitance value and reduce the change in impedance caused by an external factor, such as a protection film or an attachment product. Accordingly, it is not necessary to change the design of the wireless IC device in consideration of the dielectric constant of a product attached to the wireless IC device.

The first and second external coupling electrodes that individually occupy two areas divided from the functional substrate are provided, one of two ends of the long radiation electrode faces the first external coupling electrode, and the other one of the two ends of the long radiation electrode faces the second external coupling electrode. As a result, it is possible to easily supply electric power to the radiation electrode.

The radiation electrode is a loop-shaped radiation electrode in which both ends face each other, one of the ends is coupled to the first external coupling electrode, and the other one of the ends is coupled to the second external coupling electrode. As a result, a wireless IC device can perform communication using a magnetic field, is not significantly affected by the dielectric constant of an attachment product, and can obtain a more stable characteristic.

An auxiliary matching circuit portion is defined by a matching electrode arranged to connect a location near one of the two ends of the radiation electrode to a location near the other one of the two ends of the radiation electrode, a portion of the radiation electrode from one of the two ends to the location near one of the two ends, and a portion of the radiation electrode from the other one of the two ends to the location near the other one of the two ends. As a result, the impedance matching between the functional substrate and the radiation plate is performed twice. Therefore, it is possible to maintain a state in which the impedance matching between the functional substrate and the radiation plate is achieved in a wide frequency band, that is, to obtain a high gain in a wide frequency band.

The inductance elements are preferably loop-shaped inductance elements, and winding axes of the loop-shaped inductance elements are preferably arranged so that they cross an area in which the radiation electrode is disposed. As a result, magnetic fields are generated at the loop-shaped inductance elements in a direction that is parallel or substantially parallel to the winding axes of the loop-shaped inductance elements and is vertical or substantially vertical to the radiation electrode. Furthermore, a magnetic field is generated around the radiation electrode, since the radiation electrode is a planar electrode provided on a base material. Accordingly, the magnetic field loop generated at the functional substrate and the magnetic field loop generated at the radiation electrode are interlinked with each other. This strengthens the degree of coupling between the inductance elements and the radiation electrode.

Preferably, the external coupling electrode is a capacitive coupling electrode that is capacitively coupled to the radiation electrode. As a result, it is possible to strengthen the degree of coupling between the external coupling electrode and the radiation electrode. Furthermore, it is possible to simplify the shapes of the external coupling electrode and the radiation electrode and reduce the cost of the wireless IC device.

Preferably, the capacitive coupling electrode is provided on a surface of the functional substrate facing the radiation plate, the radiation electrode is arranged on a surface of the radiation plate facing the functional substrate, and the functional substrate is attached to the radiation plate so that the capacitive coupling electrode and the radiation electrode face each other. As a result, the gap between the capacitive coupling electrode and the radiation electrode is reduced, and the capacitance generated at the gap is increased. This strengthens the degree of coupling between the capacitive coupling electrode and the radiation electrode.

Preferably, the external coupling electrode included in the functional substrate extends to a surface other than the surface of the functional substrate facing the radiation plate. As a result, if the external coupling electrode is connected to the radiation electrode via a conductive joining material, such as solder, it is possible to strengthen the connection between the external coupling electrode and the radiation electrode and increase the impact residence of the wireless IC device.

Preferably, the external coupling electrode is a loop-shaped external coupling electrode, and a magnetic field of the loop-shaped external coupling electrode is coupled to a magnetic field of the radiation electrode. As a result, it is possible to mount the functional substrate on the radiation plate in any suitable orientation. Furthermore, it is possible to reduce the influence of the dielectric constant of a joining material used to connect the functional substrate and the radiation plate.

Preferably, at least one of the inductance elements has a double helix shape in which two different linear electrodes are arranged adjacent to each other. As a result, the two different linear electrodes can have different resonance frequencies, since they have different lengths. This increases a frequency band used by the wireless IC device.

Preferably, the radiation electrode is a loop-shaped radiation electrode, and an electromagnetic field of the loop-shaped radiation electrode is coupled to electromagnetic fields of the inductance elements included in the functional substrate. As a result, it is possible to strengthen the degree of coupling between the electromagnetic field of the loop-shaped radiation electrode and each of the electromagnetic fields of the inductance elements included in the functional substrate. Furthermore, since a necessary inductance component can be obtained in a relatively small area, it is possible to reduce the size of the wireless IC device. In addition, since the magnetic field of the loop-shaped portion of the radiation electrode is coupled to the magnetic field of the loop-shaped external coupling electrode, it is possible to obtain a predetermined characteristic regardless of the mounting orientation of the functional substrate with respect to the radiation plate.

Preferably, the matching circuit is defined by an element included in the functional substrate and an element mounted on the functional substrate. As a result, it is possible to reduce the size of the functional substrate by mounting a chip inductor having a large inductance value and a chip capacitor having a large capacitance value on the functional substrate so as to reduce the value of the element included in the functional substrate.

Preferably, the wireless IC device further includes a protection film covering at least one of the wireless IC chip, the functional substrate, and the radiation plate. As a result, it is possible to increase the environmental resistance of the wireless IC device and reduce the change in the characteristic of the wireless IC device due to an environmental change.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
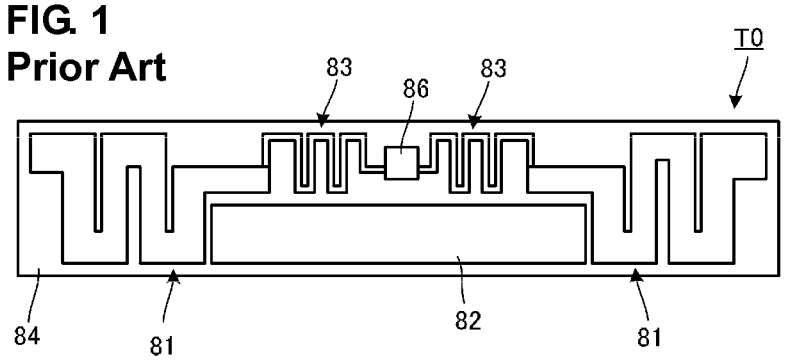
FIG. 1 is a diagram illustrating a wireless IC device disclosed in Japanese Unexamined Patent Application Publication No. 2005-244778.
Figure 2A:
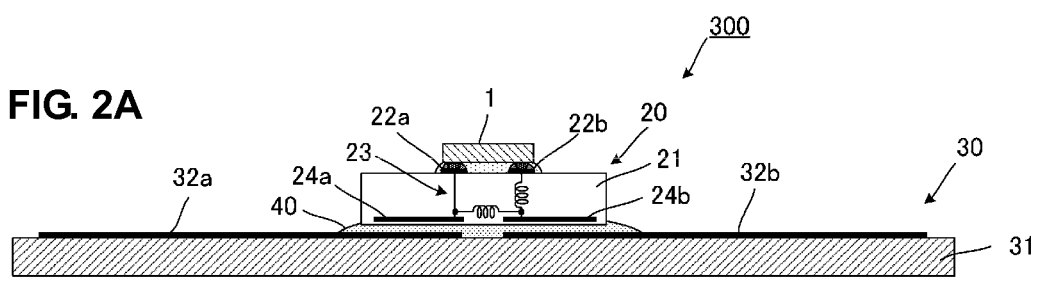
FIGS. 2A and 2B are cross-sectional views of a wireless IC device according to a first preferred embodiment of the present invention and a plan view of a main portion of the wireless IC device.
Figure 2B:
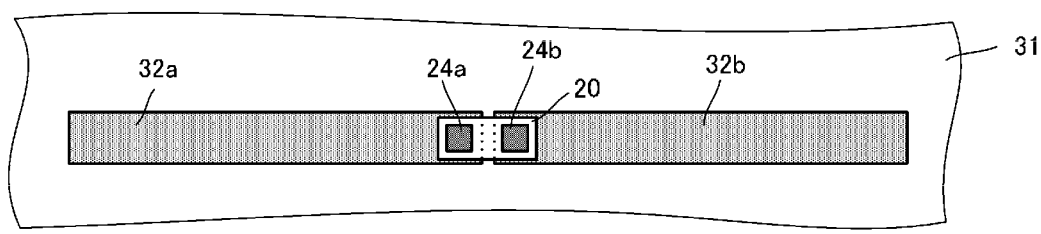

A wireless IC device according to the first preferred embodiment of the present invention will be described with reference to FIGS. 2A to 5. FIG. 2A is a cross-sectional view of a main portion of a wireless IC device according to the first preferred embodiment. FIG. 2B is a plan view of the main portion of the wireless IC device.

As illustrated in FIG. 2A, a wireless IC device 300 includes a wireless IC chip 1, a functional substrate 20, and a radiation plate 30. The wireless IC chip 1 is preferably a semiconductor chip including a signal processing circuit functioning as an RFID tag, for example.

The radiation plate 30 includes radiation electrodes 32a and 32b provided on the upper surface of a base material 31, such as a PET film, for example.

The functional substrate 20 includes a multilayer substrate 21. On the upper surface of the multilayer substrate 21, mounting electrodes 22a and 22b arranged to mount the wireless IC chip 1 are disposed. In the multilayer substrate 21, capacitive coupling electrodes 24a and 24b that are capacitively coupled to the radiation electrodes 32a and 32b, respectively are provided. The capacitive coupling electrodes 24a and 24b are external coupling electrodes of the functional substrate 20. A matching circuit 23 including the capacitive coupling electrodes 24a and 24b performs impedance matching between the wireless IC chip 1 and each of the radiation electrodes 32a and 32b provided on the radiation plate 30.

The functional substrate 20 is mounted on the radiation plate 30 via an adhesive 40 so that the capacitive coupling electrodes 24a and 24b face the internal ends of the radiation electrodes 32a and 32b, respectively.

On a surface on which the wireless IC chip 1 is mounted, a soldering bump or an Au bump, for example, is provided so that an underfill is applied in an area between the wireless IC chip 1 and the functional substrate 20 on which the mounting electrodes 22a and 22b are provided.

FIG. 2B is a plan view of an area on the upper surface of the radiation plate 30 in which the radiation electrodes 32a and 32b are provided. In this drawing, the illustration of the wireless IC chip 1 and the mounting electrodes 22a and 22b is omitted. As illustrated in FIG. 2B, the capacitive coupling electrodes 24a and 24b included in the functional substrate 20 are arranged so that they occupy two areas that are divided from the functional substrate 20. The radiation electrodes 32a and 32b are relatively long. The functional substrate 20 is disposed on the radiation plate 30 so that the capacitive coupling electrodes 24a and 24b face the internal ends of the radiation electrodes 32a and 32b, respectively.

Thus, the wireless IC chip 1 supplies electric power to the radiation electrodes 32a and 32b via the functional substrate 20, so that the radiation electrodes 32a and 32b operate as a dipole antenna.

There are several procedures for assembling the wireless IC chip 1, the functional substrate 20, and the radiation plate 30 into the wireless IC device 300. Preferably, a method of creating an electromagnetic coupling module by mounting the wireless IC chip 1 on the functional substrate 20 and mounting the created electromagnetic coupling module on the radiation plate 30 is used. A general method used to mount a semiconductor chip on a substrate can preferably be used for the mounting of the wireless IC chip 1 on the functional substrate 20 having a relatively small size. The electromagnetic coupling module can be easily mounted on the radiation plate 30 having a relatively large size via the adhesive 40.

Figure 3:
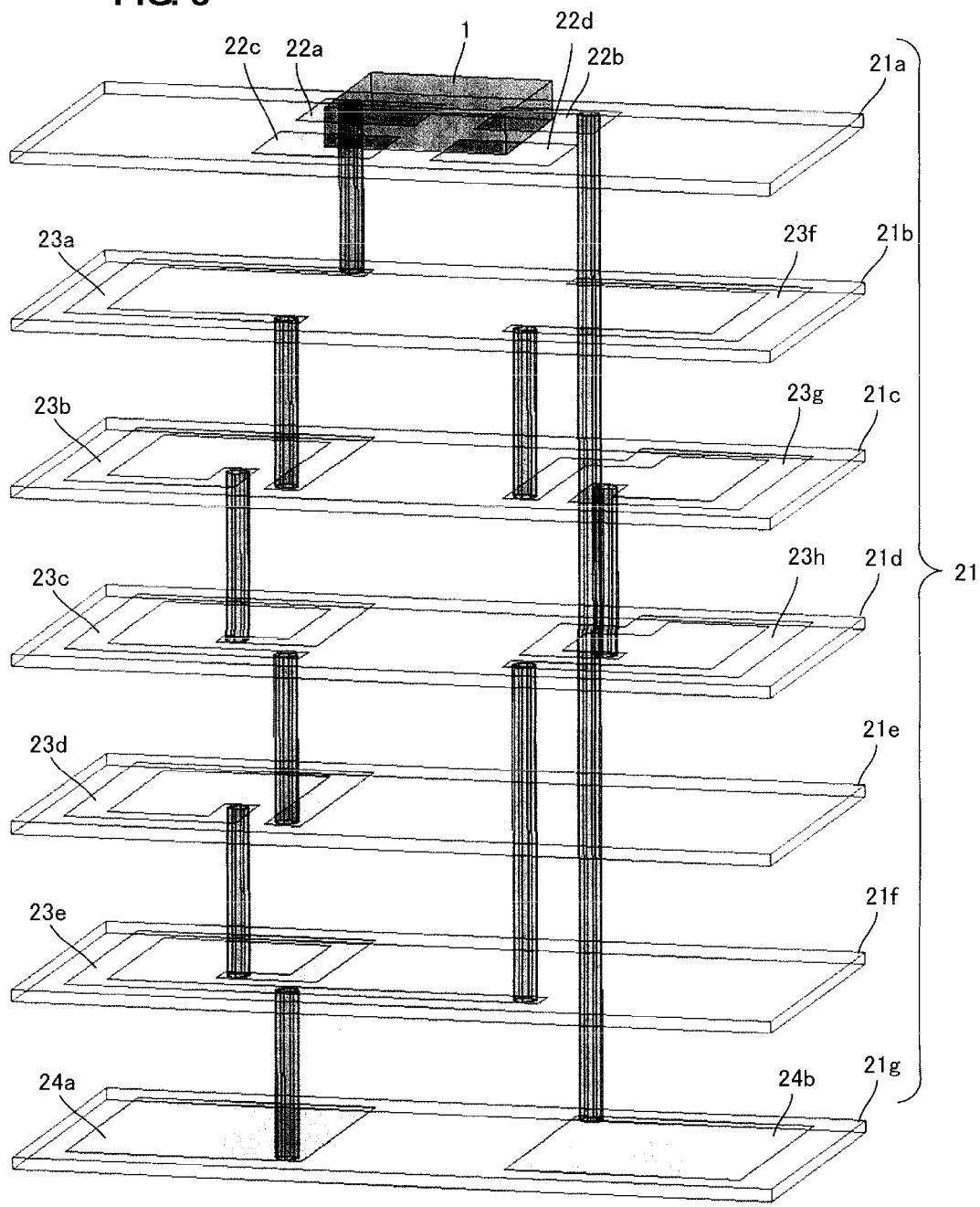
FIG. 3 is an exploded perspective view of a multilayer substrate included in a functional substrate included in the wireless IC device shown in FIGS. 2A and 2B.

FIG. 3 is an exploded perspective view of the multilayer substrate 21 included in the functional substrate 20. In this example, the wireless IC chip 1 is also illustrated. The multilayer substrate 21 preferably includes dielectric layers 21a, 21b, 21c, 21d, 21e, 21f, and 21g. On the dielectric layer 21a, the mounting electrodes 22a and 22b and mounting electrodes 22c and 22d, which are used to mount the wireless IC chip 1, are provided. On the dielectric layers 21b, 21c, 21d, 21e, and 21f, inductor electrodes 23a, 23b, 23c, 23d, and 23e are provided, respectively. On the dielectric layers 21b, 21c, and 21d, inductor electrodes 23f, 23g, and 23h are provided, respectively. On the dielectric layer 21g, capacitive coupling electrodes 24a and 24b are provided. As illustrated in FIG. 3, these dielectric layers are preferably connected to one another by a via hole.

Figure 4:
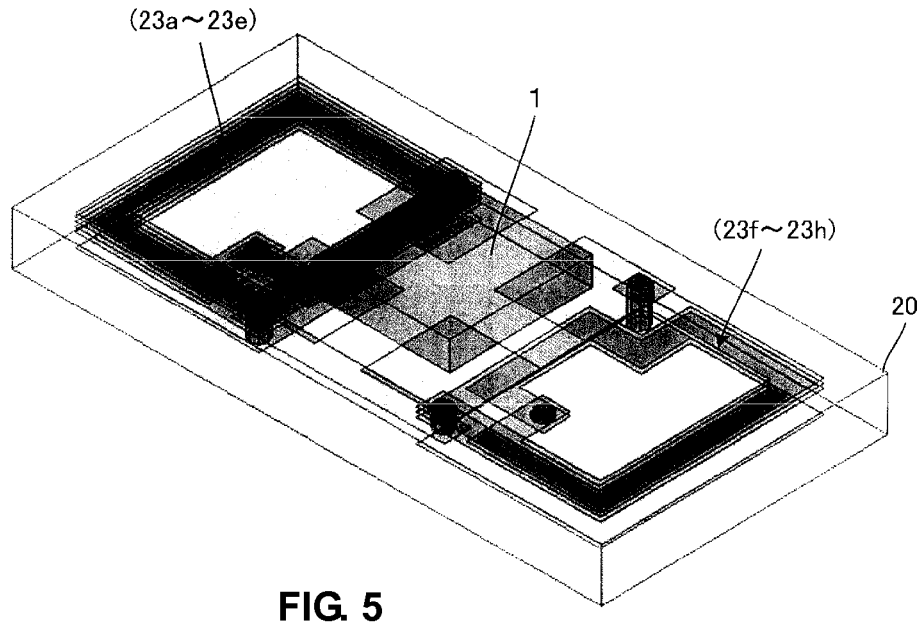
FIG. 4 is an oblique perspective view of a functional substrate on which a wireless IC chip is mounted.

FIG. 4 is an oblique perspective view of the functional substrate 20 on which the wireless IC chip 1 is mounted. The multilayer substrate included in the functional substrate 20 includes an inductor defined by the inductor electrodes 23a to 23e and an inductor defined by the inductor electrodes 23f to 23h.

Figure 5:
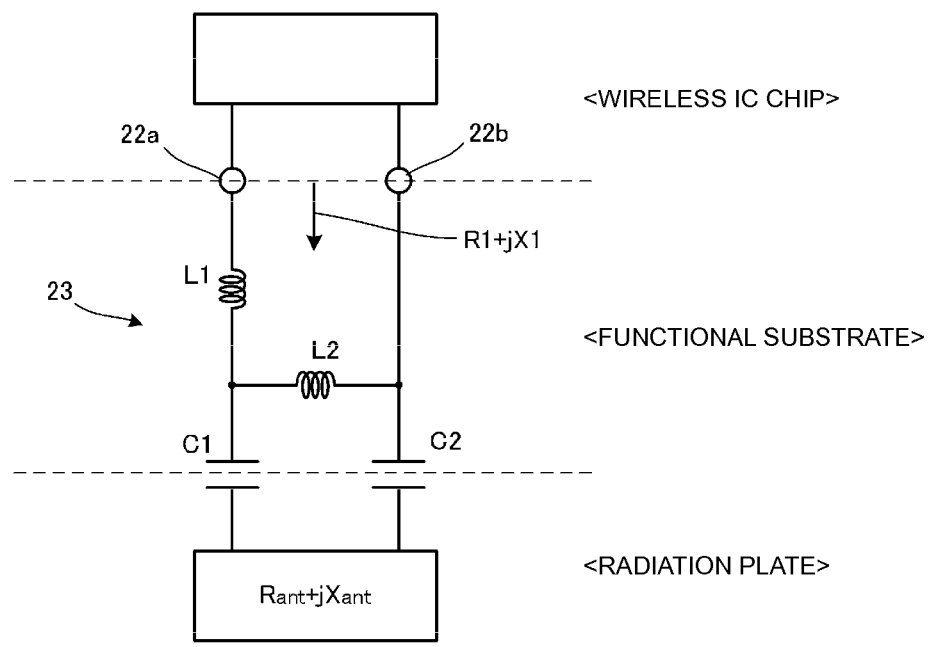
FIG. 5 is an equivalent circuit diagram of the wireless IC device shown in FIGS. 2A and 2B.

FIG. 5 is an equivalent circuit diagram of the wireless IC chip, the functional substrate, and the radiation plate. As illustrated in FIG. 5, the matching circuit 23 included in the functional substrate is preferably defined by the radiation plate, capacitors C1 and C2, and inductors L1 and L2. The inductor L1 represents the inductor defined by the inductor electrodes 23a to 23e illustrated in FIGS. 3 and 4. The inductor L2 represents the inductor defined by the inductor electrodes 23f to 23h illustrated in FIGS. 3 and 4. The capacitor C1 represents a capacitor defined between the capacitive coupling electrode 24a and the radiation electrode 32a. The capacitor C2 represents a capacitor defined between the capacitive coupling electrode 24b and the radiation electrode 32b.

An impedance obtained by viewing the wireless IC chip from a connecting portion connecting the wireless IC chip and the functional substrate to each other is represented by $R_{IC}+jX_{IC}$, and an impedance obtained by viewing the radiation electrodes provided on the radiation plate from a connecting portion connecting the functional substrate and the radiation plate to each other is represented by Rant+ jXant. For example, assuming that an impedance obtained by viewing the radiation plate (radiation electrodes) from the connecting portion connecting the wireless IC chip and the functional substrate to each other in or near a frequency range such as UHF is R1+jX1, the circuit constant of the matching circuit 23 included in the functional substrate is determined so that the relationship between $X_{IC}$ and X1 is a conjugate relationship, that is, $X1=-X_{IC}$.

The matching circuit 23 included in the functional substrate performs impedance matching between the wireless IC chip and the radiation plate (radiation electrodes). If $R_{IC}=R1$ is satisfied, that is, the relationship between $R_{IC}+jX_{IC}$ and R1+jX1 is a complex conjugate relationship, the perfect impedance matching between the wireless IC chip and the radiation plate (radiation electrodes) can be achieved. However, in reality, it is difficult for the real parts to be equal or substantially equal to each other ($R_{IC}=R1$). Accordingly, it is necessary to achieve the conjugate relationship at least between reactive components. In the above-described impedance matching, the consistency between imaginary parts is more important than the consistency between real parts.

Thus, according to the first preferred embodiment, since the capacitive coupling electrodes 24a and 24b included in the electromagnetic coupling module obtained by mounting the wireless IC chip 1 on the functional substrate 20 are disposed apart from the radiation plate 30 on which the radiation electrodes 32a and 32b are provided, the electromagnetic coupling module is DC-insulated from the radiation electrodes 32a and 32b. As a result, an excellent electrostatic discharge (ESD) characteristic can be obtained.

Furthermore, since the matching circuit 23 is included in the functional substrate 20 including the multilayer substrate disposed between the wireless IC chip 1 and the radiation plate 30, that is, since it is not necessary to provide an impedance matching circuit on the side of the radiation plate 30, an area required for the radiation electrodes 32a and 32b on the radiation plate 30 can be significantly reduced. As a result, the size of the wireless IC device can be reduced.

Still furthermore, since the matching circuit 23 is included in the multilayer substrate 21, a change in the characteristic of the matching circuit 23 is relatively small, that is, the change in the frequency characteristic of the wireless IC device 300 is relatively small even if the wireless IC device 300 is attached to a product having a high dielectric constant. Accordingly, it is not necessary to design a wireless IC device in consideration of a product to which the wireless IC device is attached. Since the matching circuit 23 is included in the multilayer substrate, it is possible to use a complex matching circuit that cannot easily be provided on a single surface as the matching circuit 23. Accordingly, it is possible to improve the impedance matching and obtain a high-gain wireless IC device.

Second Preferred Embodiment

Figure 6:
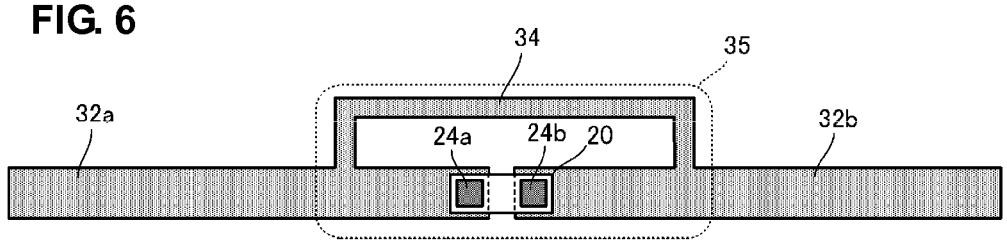
FIG. 6 is a plan view illustrating the shape of a radiation electrode provided on a radiation plate used in a wireless IC device according to a second preferred embodiment of the present invention.

FIG. 6 is a plan view illustrating an electrode pattern of a main portion on the upper surface of a radiation plate in a wireless IC device according to the second preferred embodiment of the present invention. On the upper surface of the radiation plate, the long radiation electrodes 32a and 32b and a matching electrode 34 are provided. The matching electrode 34 connects a portion of the radiation electrode 32a apart from the internal end of the radiation electrode 32a by a predetermined distance to a portion of the radiation electrode 32b apart from the internal end of the radiation electrode 32b by the predetermined distance.

As in the case illustrated in FIG. 2B, near the internal ends of the radiation electrodes 32a and 32, the functional substrate 20 is arranged so that the capacitive coupling electrodes 24a and 24b included in the functional substrate 20 face the internal ends of the radiation electrodes 32a and 32b, respectively. The illustration of the wireless IC chip mounted on the upper surface of the functional substrate is omitted in FIG. 6.

An auxiliary matching circuit portion 35 is defined by the matching electrode 34, and a portion of the radiation electrode 32a from the internal end of the radiation electrode 32a to a location connected to the matching electrode 34, and a portion of the radiation electrode 32b from the internal end of the radiation electrode 32b to a location connected to the matching electrode 34. Thus, if predetermined portions of the radiation electrodes 32a and 32b are connected to each other using the matching electrode 34, the wireless IC chip performs tap feeding so as to supply electric power to a dipole antenna via the functional substrate 20. In an area in which the tap feeding is performed, the auxiliary matching circuit portion 35 performs impedance matching twice, that is, the impedance matching between the functional substrate 20 and the radiation electrode 32a and the impedance matching between the functional substrate 20 and the radiation electrode 32b. Accordingly, it is possible to maintain a state in which impedance matching is achieved in a wide frequency band, that is, obtain a high gain in a wide frequency band. While the auxiliary matching circuit portion 35 is provided in the area in which the tap feeding is performed, it is impossible to provide a large inductor on the radiation plate due to limitations of space. Furthermore, it is difficult to provide a capacitor and a circuit in which lines cross each other on the radiation plate. However, if a functional substrate is used, it is possible to provide an inductor, a capacitor, and a circuit in which lines cross each other on the radiation plate. As a result, as described previously, it is possible to maintain a state in which impedance matching is achieved in a wide frequency band, that is, obtain a high gain in a wide frequency band.

Third Preferred Embodiment

Figure 7:
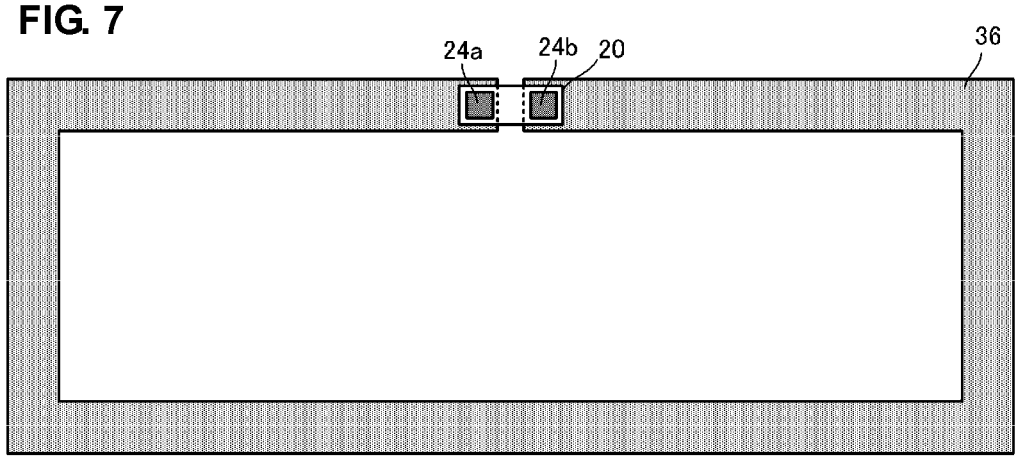
FIG. 7 is a plan view illustrating the shape of a radiation electrode formed on a radiation plate used in a wireless IC device according to a third preferred embodiment of the present invention.

FIG. 7 is a plan view illustrating an electrode pattern of a main portion on an upper surface of a radiation plate in a wireless IC device according to the third preferred embodiment of the preferred embodiment. On the upper surface of the radiation plate, a loop-shaped radiation electrode 36 is provided. The loop-shaped radiation electrode 36 is preferably arranged so that both ends thereof face each other and it surrounds a predetermined area. The functional substrate 20 is mounted on the radiation plate so that one end of the loop-shaped radiation electrode 36 faces the capacitive coupling electrode 24a included in the functional substrate 20 and the other end of the loop-shaped radiation electrode 36 faces the capacitive coupling electrode 24b included in the functional substrate 20.

As in the first and second preferred embodiments, a module is obtained by mounting the wireless IC chip on the functional substrate 20. The configuration of the functional substrate 20 according to the third preferred embodiment is substantially the same as that of the functional substrates 20 according to the first and second preferred embodiments.

Thus, if the wireless IC chip supplies electric power to the radiation electrodes 32a and 32b via the functional substrate 20, the radiation electrodes 32a and 32b operate as a magnetic field antenna. As a result, the wireless IC device can communicate with a reader/writer antenna for the wireless IC device using a magnetic field.

Fourth Preferred Embodiment

FIGS. 8A to 8D and 9A to 9D are cross-sectional views illustrating the configurations of some wireless IC devices according to the fourth preferred embodiment of the present invention. The configurations of the radiation plate 30 and the wireless IC chip 1 according to the fourth preferred embodiment are substantially the same as those of the radiation plates 30 and the wireless IC chips 1 according to the first to third preferred embodiments. In the fourth preferred embodiment, some examples of a matching circuit included in a functional substrate will be described.

Figure 8A:
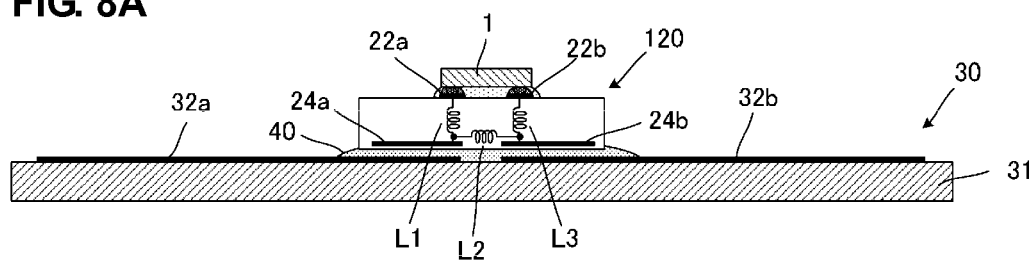
FIGS. 8A to 8D are cross-sectional views of main portions of some wireless IC devices according to a fourth preferred embodiment of the present invention.

In an example illustrated in FIG. 8A, a matching circuit is defined by the inductors L1, L2, an inductor L3, and the capacitive coupling electrodes 24a and 24b in a functional substrate 120. In the example illustrated in FIG. 5, the mounting electrode 22b is through-connected to the capacitor C2. In the matching circuit according to the fourth preferred embodiment, the inductor L3 is disposed at the through-connection portion. Accordingly, it is possible to reduce the inductance values of the inductors L1 to L3 and easily provide the inductors L1 to L3 in a multilayer substrate.

Figure 8B:
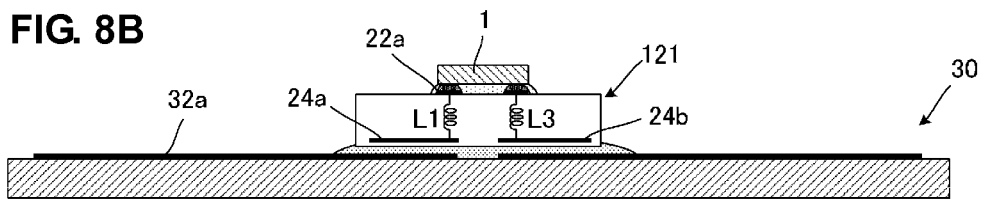

In an example illustrated in FIG. 8B, a matching circuit is defined by the inductors L1 and L3, and the capacitive coupling electrodes 24a and 24b in a functional substrate 121. In this example, a shunt inductor is not disposed between the capacitive coupling electrodes 24a and 24b. Accordingly, it is possible to easily convert a small impedance. That is, if the above-described shunt inductor has a small inductance value, it significantly changes the impedance of an impedance matching circuit. In this example, since such a shunt inductor is not used, such a problem does not arise.

Figure 8C:
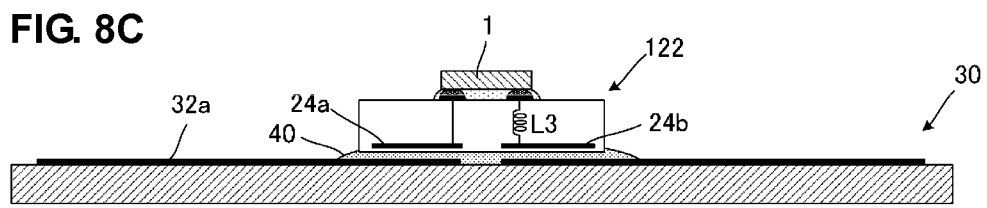

In an example illustrated in FIG. 8C, a matching circuit is defined by the inductor L3 and the capacitive coupling electrodes 24a and 24b in a functional substrate 122. In this example, since only the inductor L3 is used, it is possible to achieve the easy configuration of the matching circuit.

Figure 8D:
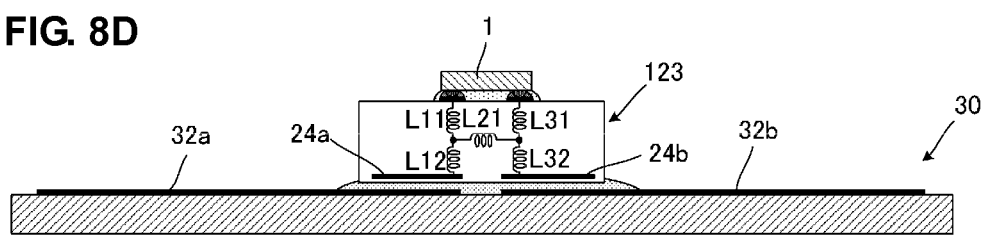

In an example illustrated in FIG. 8D, a matching circuit is defined by inductors L11, L12, L21, L31, and L32 and the capacitive coupling electrodes 24a and 24b in a functional substrate 123. In this example, since the inductors L12 and L32 are included, the inductance values of the radiation electrodes 32a and 32b can be reduced. Accordingly, the size of the radiation electrodes can be reduced.

Figure 9A:
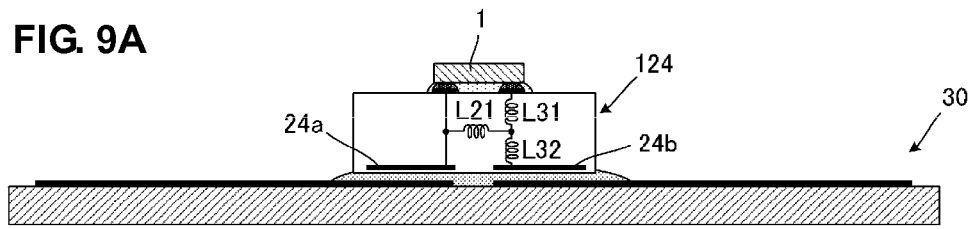
FIGS. 9A to 9D are cross-sectional views of main portions of some other wireless IC devices according to the fourth preferred embodiment of the present invention.

In an example illustrated in FIG. 9A, a matching circuit is defined by the inductors L21, L31, and L32 and the capacitive coupling electrodes 24a and 24b in a functional substrate 124. In this example, since the inductors L11 and L12 illustrated in FIG. 8D are removed, it is possible to provide an easy configuration of the matching circuit while enabling the matching circuit to have the characteristic illustrated in FIG. 8D.

Figure 9B:
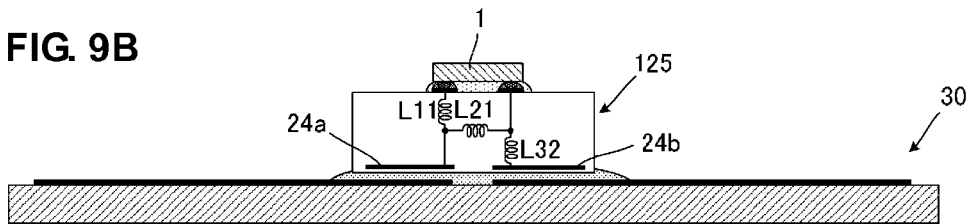

In an example illustrated in FIG. 9B, a matching circuit is defined by the inductors L11, L21, and L32 and the capacitive coupling electrodes 24a and 24b in a functional substrate 125. In this example, the location of the inductor L31 illustrated in FIG. 9A is changed. Accordingly, it is possible to provide easy wiring in the multilayer substrate while enabling the matching circuit to have the same or substantially the same effect as that illustrated in FIG. 9A.

Figure 9C:
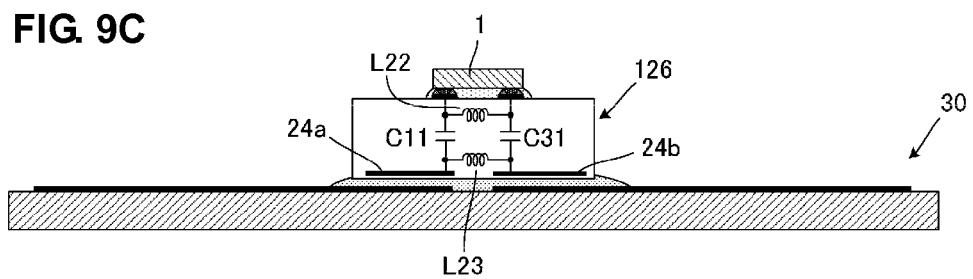

In an example illustrated in FIG. 9C, a matching circuit is defined by capacitors C11 and C31, inductors L22 and L23, and the capacitive coupling electrodes 24a and 24b in a functional substrate 126. In this example, since the matching circuit includes the capacitors C11 and C31 connected in series to each other, it is possible to achieve the impedance matching between each of the radiation electrodes (antenna) having a capacitive impedance and the wireless IC chip 1 having a capacitive impedance in a wide frequency range.

Figure 9D:
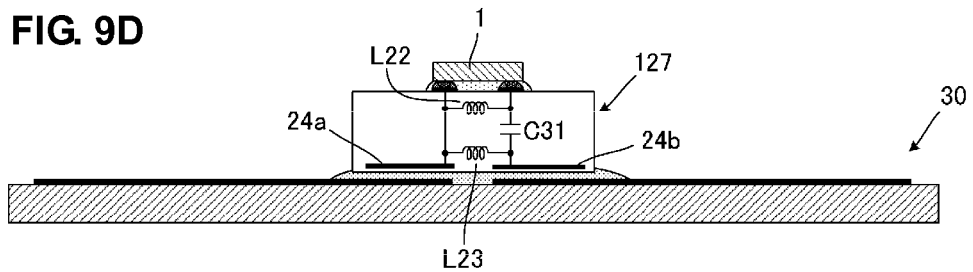

In an example illustrated in FIG. 9D, a matching circuit is defined by the inductors L22 and L23, the capacitor C31, and the capacitive coupling electrodes 24a and 24b in a functional substrate 127. In this example, since the capacitors C11 and C31 illustrated in FIG. 3C are integrated into the capacitor C31, it is possible to achieve easy pattern formation in the multilayer substrate while enabling the matching circuit to have the same or substantially the same effect as that illustrated in FIG. 9C.

The circuit constant of each of the matching circuits included in the functional substrates 120 to 127 is preferably determined so that the relationship between the reactive component of an impedance obtained by viewing the wireless IC chip from the connecting portion connecting the wireless IC chip and the functional substrate to each other and the reactive component of an impedance obtained by viewing the radiation electrodes from the connecting portion connecting the wireless IC chip and the functional substrate to each other is a conjugate relationship. Thus, a matching circuit including at least one inductance element and at least one capacitance element as required.

Fifth Preferred Embodiment

Figure 10:
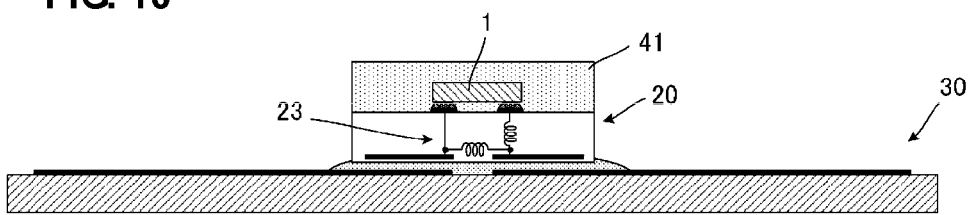
FIG. 10 is a cross-sectional view of a main portion of a wireless IC device according to a fifth preferred embodiment of the present invention.

FIG. 10 is a cross-sectional view of a main portion of a wireless IC device according to the fifth preferred embodiment of the present invention. As illustrated in FIG. 10, the wireless IC chip 1 is mounted on the upper surface of the functional substrate 20, and the wireless IC chip 1 is covered with a resin 41 on the upper surface of the functional substrate 20 so that a flat upper surface is obtained. Other configurations are substantially the same as those described in the first preferred embodiment.

Thus, when an electromagnetic coupling module obtained by mounting the wireless IC chip 1 on the functional substrate 20 is mounted on the radiation plate 30, it is possible to easily grasp the electromagnetic coupling module by suction and chuck the electromagnetic coupling module on the radiation plate 30. Since the wireless IC chip 1 is embedded in the resin 41, the environmental resistance of the wireless IC chip 1 is increased.

A protection film may preferably be arranged on not only the wireless IC chip 1 but also on the functional substrate 20 or the radiation plate 30. Alternatively, a protection film may preferably be arranged so as to cover all of the wireless IC chip 1, the functional substrate 20, and the radiation plate 30. This is also true for other preferred embodiments of the present invention.

Sixth Preferred Embodiment

Figure 11:
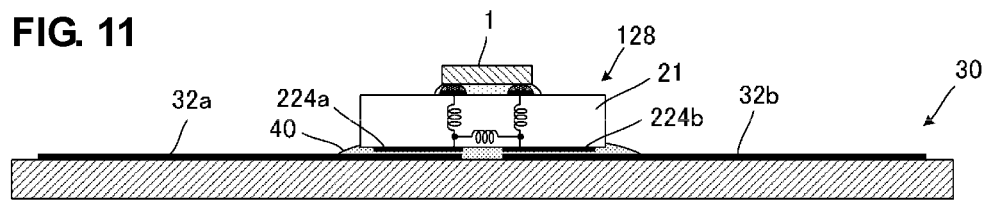
FIG. 11 is a cross-sectional view of a main portion of a wireless IC device according to a sixth preferred embodiment of the present invention.
Figure 12:
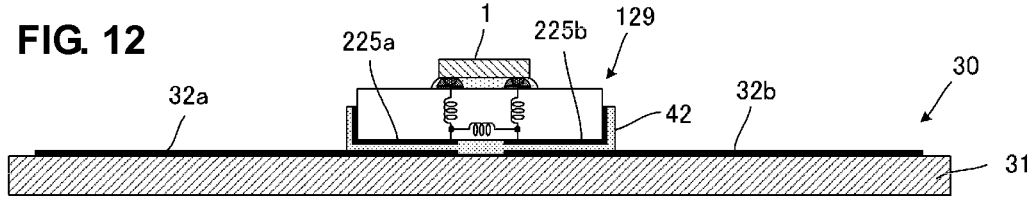
FIG. 12 is a cross-sectional view of a main portion of another wireless IC device according to the sixth preferred embodiment of the present invention.

FIGS. 11 and 12 are cross-sectional views of main portions of wireless IC devices according to the sixth preferred embodiment of the present invention. In an example illustrated in FIG. 11, a functional substrate 128 includes the multilayer substrate 21, and capacitive coupling electrodes 224a and 224b are arranged so that they are exposed at the undersurface of the multilayer substrate 21.

The capacitive coupling electrodes 224a and 224b face the internal ends of the radiation electrodes 32a and 32b, respectively, via the adhesive 40. As a result, a large capacitance can be generated between the capacitive coupling electrode 224a and the internal end of the radiation electrode 32a and between the capacitive coupling electrode 224b and the internal end of the radiation electrode 32b.

In an example illustrated in FIG. 12, each of external coupling electrodes 225a and 225b is arranged so as to extend from the undersurface to the side surface of a functional substrate 129. The coupling electrodes 225a and 225b are preferably connected to the radiation electrodes 32a and 32b, respectively, via a conductive joining material 42, such as solder, for example.

As a result, it is possible to achieve the direct electrical connection between the coupling electrode 225a included in the functional substrate 129 and the radiation electrode 32a provided on the radiation plate 30 and the direct electrical connection between the coupling electrode 225b included in the functional substrate 129 and the radiation electrode 32b provided on the radiation plate 30. Furthermore, it is possible to increase the mechanical strength of the wireless IC device by increasing a solder connecting area.

Seventh Preferred Embodiment

Figure 13:
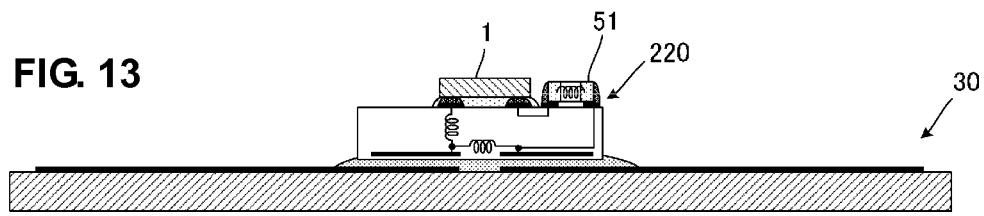
FIG. 13 is a cross-sectional view of a main portion of a wireless IC device according to a seventh preferred embodiment of the present invention.

FIG. 13 is a cross-sectional view of a main portion of a wireless IC device according to the seventh preferred embodiment of the present invention. Referring to FIG. 13, a multilayer substrate is included in a functional substrate 220. The multilayer substrate includes inductance electrodes and capacitive coupling electrodes. On the upper surface of the multilayer substrate, a chip inductor 51 that is preferably a discrete component is mounted. A matching circuit is defined by the internal electrodes included in the functional substrate 220 and the external chip component.

In a wireless IC device having the above-described configuration, it is possible to reduce the size of the functional substrate by mounting a chip inductor having a large inductance value or a chip capacitor having a large capacitance value on the functional substrate so as to reduce the inductance or capacitance value of an element included in the functional substrate.

Eighth Preferred Embodiment

Figure 14:
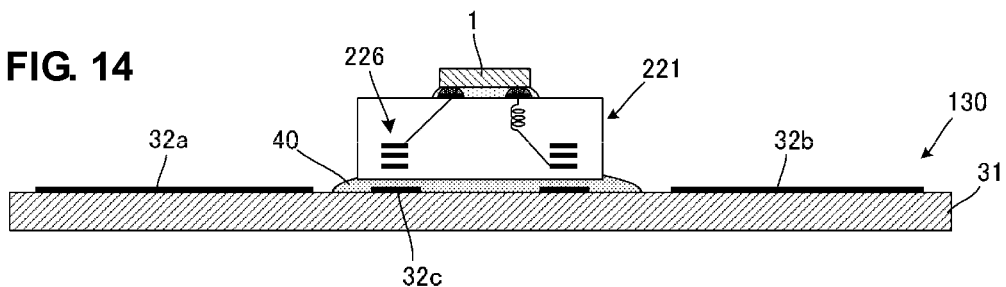
FIG. 14 is a cross-sectional view of a main portion of a wireless IC device according to an eighth preferred embodiment of the present invention.

A wireless IC device according to the eighth preferred embodiment of the present invention will be described with reference to FIGS. 14 to 16B. FIG. 14 is a cross-sectional view of a main portion of a wireless IC device according to the eighth preferred embodiment. In a radiation plate 130, the radiation electrodes 32a, 32b, and 32c are provided on the upper surface of the base material 31. A functional substrate 221 includes a loop-shaped external coupling electrode 226. An electromagnetic coupling module obtained by mounting the wireless IC chip 1 on the functional substrate 221 is mounted on the radiation plate 130 so that the magnetic field of the loop-shaped external coupling electrode 226 and the magnetic field of the radiation electrode 32c are coupled to each other.

Figure 15:
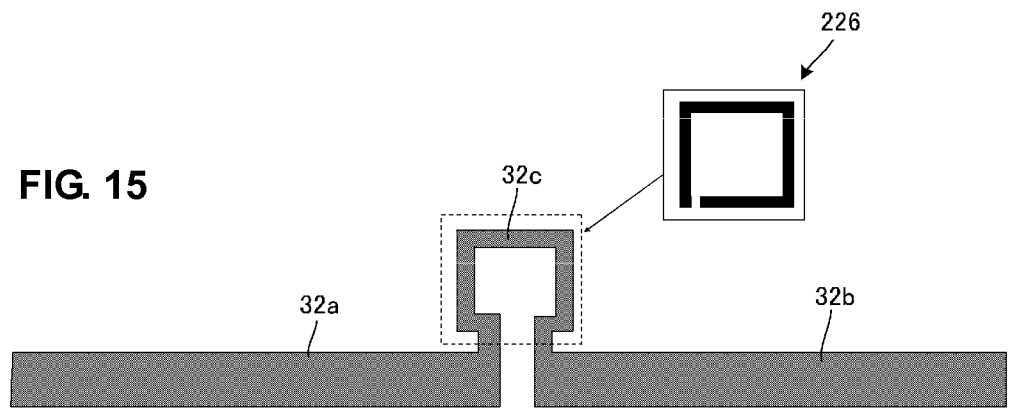
FIG. 15 is diagram illustrating the configuration of a radiation electrode provided on a radiation plate and the shape of a loop-shaped external coupling electrode included in a functional substrate in the wireless IC device.

FIG. 15 is a plan view of radiation electrodes provided on the upper surface of the radiation plate 130 and a loop-shaped external coupling electrode included in the functional substrate 221. The radiation electrodes 32a and 32b, which are relatively long, are connected to each other by the loop-shaped radiation electrode 32c. The loop-shaped external coupling electrode 226 included in the functional substrate is preferably spirally wound with a plurality of turns and a size that is about the same as the loop-shaped radiation electrode 32c.

Thus, the winding axis of the loop-shaped external coupling electrode 226 that is an inductance element that is spirally wound with a plurality of turns crosses an area in which the radiation electrode 32c is provided. As a result, a magnetic field is generated at the loop-shaped external coupling electrode 226 in a direction that is parallel or substantially parallel to the winding axis and is vertical or substantially vertical to the radiation electrode 32c, and a magnetic field is generated around (in and out of) the radiation electrode 32c. Accordingly, a magnetic field loop generated at the functional substrate 221 is interlinked with a magnetic field loop generate at the radiation electrode 32c, so that the degree of coupling between the loop-shaped external coupling electrode 226 and the radiation electrode 32c can be further increased.

In the examples illustrated in FIGS. 14 and 15, the loop-shaped radiation electrode 32c is provided. However, instead of a loop-shaped radiation electrode, for example, a dipole electrode may preferably be used as the radiation electrode 32c. Such a dipole electrode can also be strongly coupled to the loop-shaped external coupling electrode 226, since the magnetic flux of the loop-shaped external coupling electrode 226 passes around the radiation electrode 32c and is then coupled to the magnetic field of the radiation electrode 32c.

Furthermore, in the examples illustrated in FIGS. 14 and 15, the loop-shaped external coupling electrode 226 that is spirally wound is provided. However, a loop-shaped external coupling electrode that is wound with a single turn may preferably be used as the loop-shaped external coupling electrode 226.

Figure 16A:
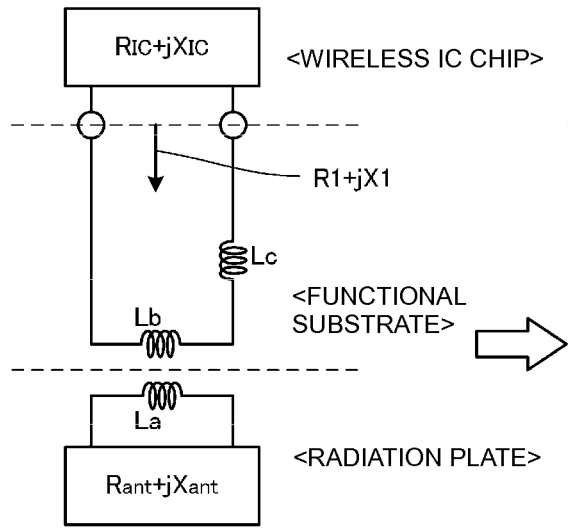
FIGS. 16A and 16B are impedance circuit diagrams of the wireless IC device shown in FIG. 14.
Figure 16B:
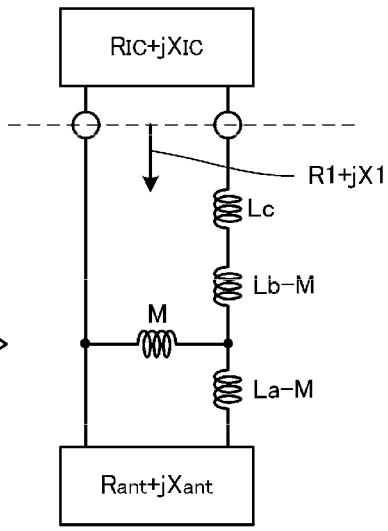

FIGS. 16A and 16B are impedance circuit diagrams of the above-described wireless IC chip, the above-described functional substrate, and the above-described radiation plate. Referring to FIG. 16A, an inductor La on the side of the radiation plate is an inductor at the radiation electrode 32c, and an inductor Lb on the side of the functional substrate is an inductor at the loop-shaped external coupling electrode 226. One terminal of the wireless IC chip 1 is connected in series to an inductor Lc.

If the mutual inductance between the inductors La and Lb between which a magnetic field coupling is achieved is represented by M, the circuit illustrated in FIG. 16A can be changed to a circuit illustrated in FIG. 16B. The inductors La, Lb, and Lc illustrated in FIG. 16A are determined so that the relationship between $X_{IC}$ and X1 illustrated in FIG. 16B is a conjugate relationship.

Thus, since a matching circuit includes the inductor at the radiation electrode 32c, the impedance matching between an antenna defined by the radiation electrodes 32a and 32b and the wireless IC chip can be achieved.

According to the eighth preferred embodiment, since both of the radiation electrode 32c on the side of the radiation plate and the loop-shaped external coupling electrode 226 on the side of the functional substrate are loop-shaped electrodes, the mounting direction of the module, which is obtained by mounting the wireless IC chip 1 on the functional substrate 221, with respect to the radiation plate 130 has substantially no effect on the characteristics. That is, if the module is mounted on the radiation plate 130 in any orientation, a predetermined characteristic can be obtained.

Ninth Preferred Embodiment

Figure 17:
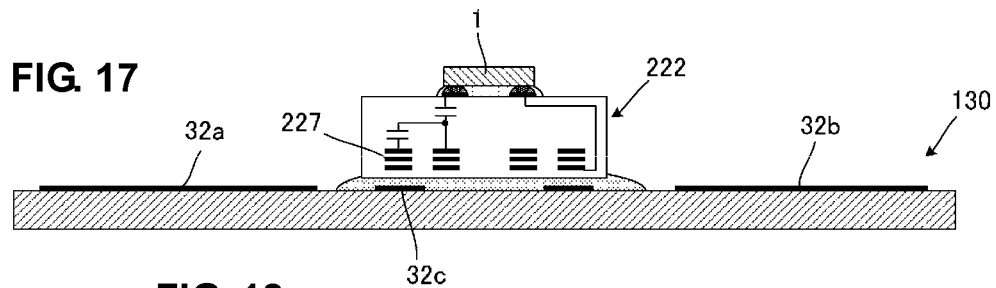
FIG. 17 is a cross-sectional view of a main portion of a wireless IC device according to a ninth preferred embodiment of the present invention.

FIG. 17 is a cross-sectional view of a main portion of a wireless IC device according to the ninth preferred embodiment of the present invention. In this example, a functional substrate 222 includes a double helix external coupling electrode 227. The magnetic field of the double helix external coupling electrode 227 and the magnetic field of the loop-shaped radiation electrode 32c provided on the radiation plate 130 are coupled to each other.

The double helix external coupling electrode 227 has a double helix configuration in which two different linear electrodes are adjacent to each other and ends of these linear electrodes are electrically connected to each other. The pattern of the radiation electrodes provided on the radiation plate 130 is substantially the same as that illustrated in FIG. 15.

Figure 18:
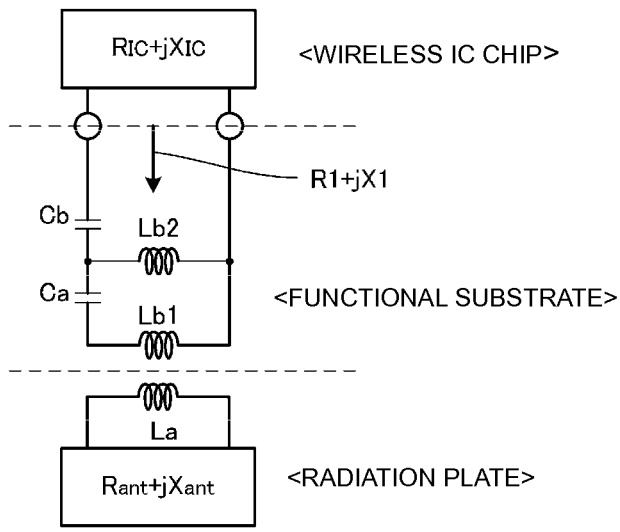
FIG. 18 is an impedance circuit diagram of the wireless IC device shown in FIG. 17.

FIG. 18 is an impedance circuit diagram of the wireless IC chip illustrated in FIG. 17. Inductors Lb1 and Lb2 included in a functional substrate are inductors at the double helix external coupling electrode 227. Capacitors Ca and Cb are capacitors included in the multilayer substrate included in the functional substrate 222. The inductor La at a radiation substrate is an inductor at the loop-shaped radiation electrode 32c. The magnetic field of the inductor La is coupled to the magnetic fields of the inductors Lb1 and Lb2 at the double helix external coupling electrode.

The constants of circuit elements of the matching circuit included in the functional substrate are determined so that the relationship between a reactance component $X_{IC}$ of an impedance obtained by viewing the wireless IC chip from a connecting portion connecting the wireless IC chip and the functional substrate to each other and a reactance component X1 of an impedance obtained by viewing the radiation electrodes 32a and 32b from the connecting portion connecting the wireless IC chip and the functional substrate to each other is a conjugate relationship.

Thus, by using an external coupling electrode having a double helix shape, the degree of coupling between the external coupling electrode and a radiation electrode can be increased. Furthermore, since the two lines included in the double helix external coupling electrode have different lengths, the two lines can have different resonance frequencies. Accordingly, it is possible to increase a frequency band used by the wireless IC device.

Tenth Preferred Embodiment

Figure 19:
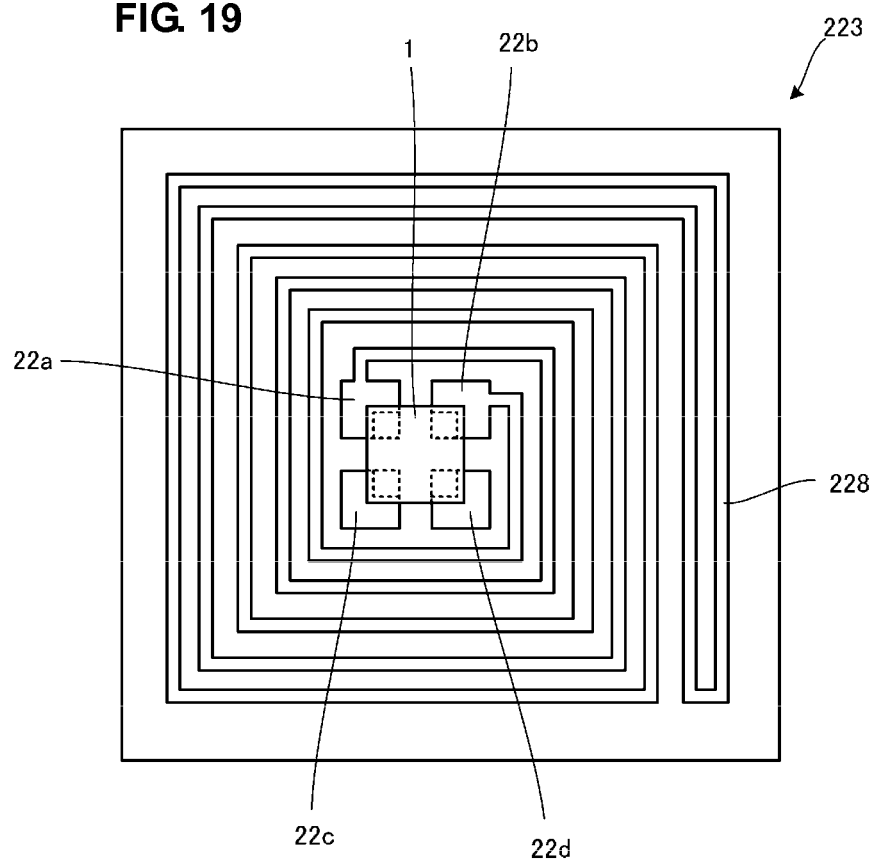
FIG. 19 is a plan view of an electromagnetic coupling module used in a wireless IC device according to a tenth preferred embodiment of the present invention.

FIG. 19 is a plan view illustrating the configuration of a functional substrate used in a wireless IC device according to the tenth preferred embodiment of the present invention. In this example, an electrode pattern is provided on only the upper surface of a functional substrate 223. As illustrated in FIG. 19, a double helix external coupling electrode 228 is provided on the upper surface of the functional substrate 223, and the inner ends of the double helix external coupling electrode 228 define the mounting electrodes 22a and 22b for the wireless IC chip 1. Other mounting electrodes 22c and 22d are provided near the mounting electrodes 22a and 22b. An electromagnetic coupling module is obtained by mounting the wireless IC chip 1 on the mounting electrodes 22a to 22d.

The configuration of a radiation electrode on the side of a radiation plate is substantially the same as that illustrated in FIG. 15. The electromagnetic coupling module illustrated in FIG. 19 is preferably arranged so as to face the loop-shaped radiation electrode 32c as illustrated in FIG. 15. As a result, the double helix external coupling electrode 228 is electromagnetically coupled to the loop-shaped radiation electrode 32c. Thus, an impedance matching circuit can be obtained without using a multilayer substrate.

In the above-described preferred embodiments, various typical examples of a wireless IC device have been described. However, a wireless IC device may be obtained by combining configurations described in any of the above preferred embodiments.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless integrated circuit (IC) device comprising:
   a wireless IC chip including first and second IC terminals;
   a radiation plate including first and second radiation terminals arranged on a base material, the first radiation terminal being connected to the first IC terminal, and the second radiation terminal being connected to the second IC terminal; and
   a functional substrate including a matching circuit including first and second inductance elements disposed inside the functional substrate, the wireless IC chip being mounted on the functional substrate so as to define a module, and the module being mounted on the base material so as to connect the wireless IC chip with the radiation plate via the matching circuit; wherein
   a first end of the first inductance element is connected to one of the first or second IC terminals and a second end of the first inductance element is connected to one of the first or second radiation terminals;
   a first end of the second inductance element is connected to the first radiation terminal and a second end of the second inductance element is connected to the second radiation terminal; and
   the matching circuit is configured such that a relationship between a reactance component of an impedance obtained by viewing the wireless IC chip from a connecting portion connecting the wireless IC chip and the functional substrate to each other and a reactance component of an impedance obtained by viewing the radiation plate from the connecting portion connecting the wireless IC chip and the functional substrate to each other is a conjugate relationship.

2. The wireless IC device according to claim 1, wherein the functional substrate includes a multilayer substrate including laminated dielectric layers on which electrode patterns are provided.

3. The wireless IC device according to claim 1, wherein the matching circuit includes an element included in the functional substrate and an element mounted on the functional substrate.

4. The wireless IC device according to claim 1, further comprising a protection film covering at least one of the wireless IC chip, the functional substrate, and the radiation plate.

5. The wireless IC device according to claim 1, wherein the matching circuit is electromagnetically coupled to the radiation plate.

6. The wireless IC device according to claim 1, wherein the radiation plate has an elongated configuration;
   the matching circuit includes first and second external coupling electrodes that individually occupy two areas divided from the functional substrate; and
   one end of the radiation plate is coupled to the first external coupling electrode and another end of the radiation plate is coupled to the second external coupling electrode.

7. The wireless IC device according to claim 6, wherein
   the radiation plate is a loop-shaped radiation plate arranged such that both ends of the radiation plate face each other;
   a first one of the both ends of the radiation plate is coupled to the first external coupling electrode; and
   a second one of the both ends of the radiation plate is coupled to the second external coupling electrode.

8. The wireless IC device according to claim 6, further comprising an auxiliary matching circuit portion including a matching electrode;
   the radiation plate includes a first radiation electrode and a second radiation electrode;
   the first radiation electrode includes a first internal end, the second radiation electrode includes a second internal end, and the first internal end and the second internal end are provided adjacent to each other;
   the matching electrode is connected to the first radiation electrode at a point adjacent to the first internal end;
   the matching electrode is connected to the second radiation electrode at a point adjacent to the second internal end; and
   the auxiliary matching circuit portion further includes a portion of the first radiation electrode from the first internal end to the point connected with the matching electrode and a portion of the second radiation electrode from the second internal end to the point connected with the matching electrode.

9. The wireless IC device according to claim 1, wherein
   the first and second inductance elements are loop-shaped inductance elements; and
   winding axes of the loop-shaped first and second inductance elements cross an area in which the radiation plate is located.

10. The wireless IC device according to claim 1, wherein the matching circuit includes a capacitive coupling electrode that faces the radiation plate and is capacitively coupled to the radiation plate.

11. The wireless IC device according to claim 10, wherein
   the capacitive coupling electrode is provided on a surface of the functional substrate facing the radiation plate; and
   the functional substrate is attached to the radiation plate so that the capacitive coupling electrode and the radiation plate face each other.

12. The wireless IC device according to claim 10, wherein the capacitive coupling electrode included in the functional substrate extends to a surface other than the surface of the functional substrate facing the radiation plate.

* * * * *